(12) United States Patent
Kim et al.

(10) Patent No.: US 7,436,704 B2
(45) Date of Patent: Oct. 14, 2008

(54) NON-VOLATILE MEMORY DEVICES AND METHOD THEREOF

(75) Inventors: Won-Joo Kim, Suwon-si (KR);
Sung-Jae Byun, Seongnam-si (KR);
Yoon-Dong Park, Yongin-si (KR);
Eun-Hong Lee, Anyang-si (KR);
Suk-Pil Kim, Yongin-si (KR);
Jae-Woong Hyun, Uijeongbu-si (KR)

(73) Assignee: Samsung Electronics, Co. Ltd., Gyeonggi-do (KR)

( * ) Notice: Subject to any disclaimer, the term of this patent is extended or adjusted under 35 U.S.C. 154(b) by 103 days.

(21) Appl. No.: 11/490,129

(22) Filed: Jul. 21, 2006

(65) Prior Publication Data
US 2007/0103963 A1  May 10, 2007

(30) Foreign Application Priority Data
Nov. 9, 2005  (KR) .................. 10-2005-0107029

(51) Int. Cl.
*G11C 11/34* (2006.01)
(52) U.S. Cl. .............. 365/185.05; 365/63; 365/105
(58) Field of Classification Search ............. 365/63, 365/185.05, 105, 158
See application file for complete search history.

(56) References Cited
U.S. PATENT DOCUMENTS 5,247,206 A * 9/1993 Castro ................. 706/35
6,635,532 B2 10/2003 Song et al.
2004/0160825 A1* 8/2004 Bhattacharyya ........ 365/185.08

FOREIGN PATENT DOCUMENTS
WO      WO 96/41381      12/1996

* cited by examiner

*Primary Examiner*—Son Dinh
(74) *Attorney, Agent, or Firm*—Harness, Dickey & Pierce, P.L.C.

(57) ABSTRACT

Non-volatile memory devices and a method thereof are provided. A non-volatile memory device according to an example embodiment of the present invention may include a first transistor including a source, a drain, and a control gate, a first storage node coupled to the first transistor, the first storage node configured to store information in a first manner, a first diode having a first end connected to the source of the transistor, the first diode configured to rectify a flow of current from the source of the transistor and a second storage node connected to a second end of the first diode, the second storage node configured to store information in a second manner. Another non-volatile memory device according to another example embodiment of the present invention may include a semiconductor substrate having a first conductivity type including an active region defined by a device isolating layer, a source region and a drain region formed by doping an impurity having a second conductivity type in the active region, a control gate electrode insulated from the active region, the control gate electrode extending across the active region disposed between the source region and the drain region, a first storage node layer interposed between the active region and the control gate electrode configured to store information in a first manner, a second storage node layer disposed on the source region configured to store information in a second manner and a diode interposed between the source region and the second storage node layer to rectify a flow of current to the source region. The example method may be directed to obtaining a higher storage capacity per cell area in either of the above-described example non-volatile memory devices.

26 Claims, 4 Drawing Sheets

NON-VOLATILE MEMORY DEVICES AND METHOD THEREOF

PRIORITY STATEMENT

This application claims the benefit of Korean Patent Application No. 10-2005-0107029, filed on Nov. 9, 2005, in the Korean Intellectual Property Office, the disclosure of which is incorporated herein in its entirety by reference.

BACKGROUND OF THE INVENTION

1. Field of the Invention

Example embodiments of the present invention are directed to non-volatile memory devices and a method thereof, and more particularly to non-volatile memory devices and a method of obtaining a higher storage capacity per cell area in the non-volatile memory devices.

2. Description of the Related Art

A conventional portable electronic appliance may have a higher capacitance even as a size of the portable electronic appliance is reduced. Due to the reduced size and higher capacitance of portable electronic appliances, non-volatile memory devices may be used within portable electronic appliances to attain higher integration and higher capacitance. However, the higher integration may be achieved by forming higher integration patterns, which may not scale as portable electronic appliances are reduced further in size due to limits of photolithographic processes.

For example, a NOR-type flash memory device may include a cell area of at least 2F×3F, or $6F^2$, to process 2-bit data. Here, 1F may correspond to a width of a word line. Therefore, the cell area required for processing unit-bit data may be relatively high.

A conventional non-volatile memory device using a variable resistor as a storage node and a stack-type diode as a switching unit will be described below with reference to FIGS. 1 and 2.

FIG. 1 is a circuit diagram illustrating a conventional non-volatile memory device using a diode as a switching unit. FIG. 2 is a plan view illustrating a structure of the non-volatile memory device of FIG. 1. Referring to FIG. 1, the conventional non-volatile memory device may include a circuit arrangement with a diode JD and a variable resistor R connected between a bit line BL and a word line WL. Referring to FIG. 2, the conventional circuit arrangement of FIG. 1 may be arranged on a semiconductor substrate (not shown). A variable resistor 55 may be disposed on an active region 52 of the semiconductor substrate, and a metal line 60 may be placed on the variable resistor 55 extending across the active region 52. The word line 50 may be connected to the active region 52, and the metal line 60 may act as a bit line BL.

A non-volatile memory device (e.g., a Phase-change Random Access memory (PRAM)), may occupy a cell area of at least 2F×2F, or $4F^2$, to process 2-bit data with a unit cell C as a reference. Accordingly, by employing a PRAM including a diode (e.g., such as the diode JD), the cell area for processing the unit-bit data may be decreased as compared with a non-volatile memory device that may use a transistor for the cell area to process the unit-bit data. However, a conventional PRAM using the diode may have difficulty performing multi-level operations.

SUMMARY OF THE INVENTION

An example embodiment of the present invention is directed to a non-volatile memory device, including a first transistor including a source, a drain, and a control gate, a first storage node coupled to the first transistor, the first storage node configured to store information in a first manner, a first diode having a first end connected to the source of the transistor, the first diode configured to rectify a flow of current from the source of the transistor and a second storage node connected to a second end of the first diode, the second storage node configured to store information in a second manner.

Another example embodiment of the present invention is directed to a non-volatile memory device, including a semiconductor substrate having a first conductivity type including an active region defined by a device isolating layer, a source region and a drain region formed by doping an impurity having a second conductivity type in the active region, a control gate electrode insulated from the active region, the control gate electrode extending across the active region disposed between the source region and the drain region, a first storage node layer interposed between the active region and the control gate electrode configured to store information in a first manner, a second storage node layer disposed on the source region configured to store information in a second manner and a diode interposed between the source region and the second storage node layer to rectify a flow of current to the source region.

Another example embodiment of the present invention is directed to a method of obtaining a higher storage capacity per cell area in a non-volatile memory device, including storing information in a first manner at a first storage node, storing information in a second manner at a second storage node, coupling a transistor to the first storage node, coupling a first end of a diode to a source of the transistor, the diode configured to rectify a flow of current from the source of the transistor and coupling a second end of the diode to the second storage node.

Another example embodiment of the present invention is directed to a hybrid-type non-volatile memory device for processing data of with a higher capacitance by reducing a cell area to process unit-bit data.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
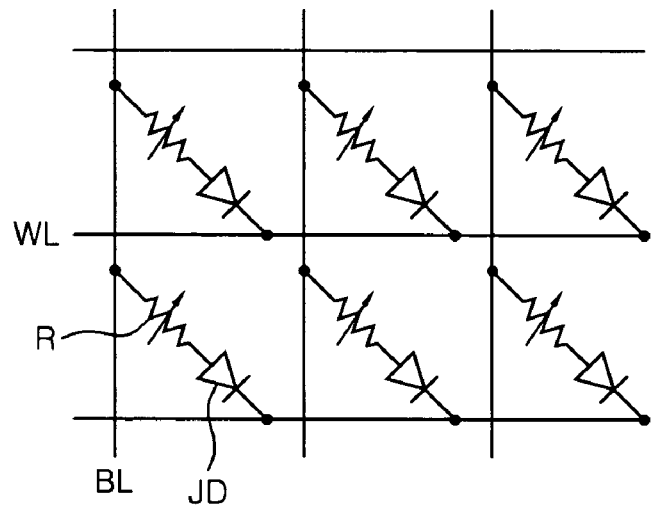
FIG. 1 is a circuit diagram illustrating a conventional non-volatile memory device using a diode as a switching unit.
Figure 2:
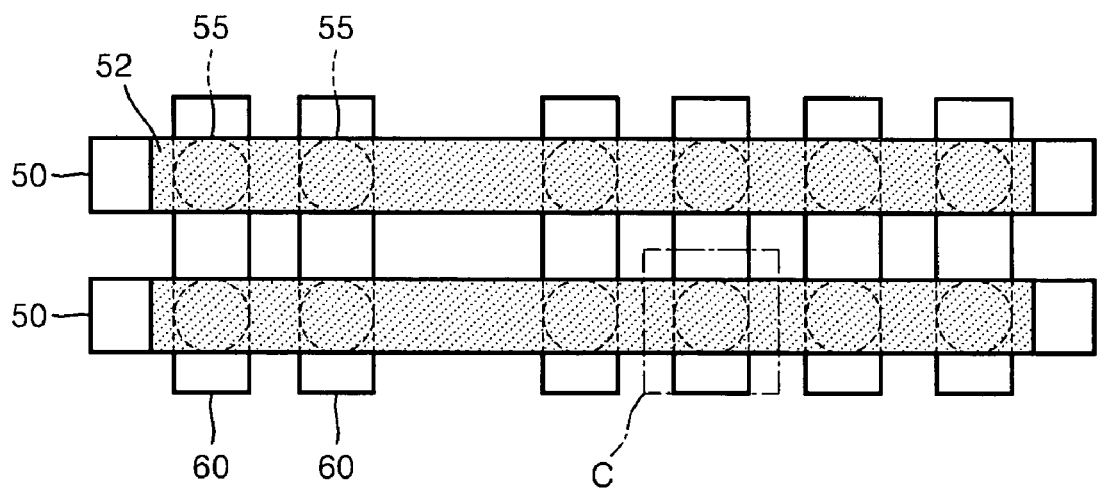
FIG. 2 is a plan view illustrating a structure of the non-volatile memory device of FIG. 1.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As will be described in greater detail below, non-volatile memory devices according to example embodiments of the present invention may include memory units mutually which may be coupled together using respective switching units. The respective switching units may operate with different switching protocols. Accordingly, the non-volatile memory devices may be referred to as "hybrid-type" non-volatile memory devices because of the disparate switching protocols employed therein. For example, a non-volatile memory device according to an example embodiment of the present invention may include a first memory unit, including a transistor as a switching unit, coupled with a second memory unit, including a diode as a switching unit. Furthermore, the first memory unit may use a storage node of a charge-storing type, and the second memory unit may use a storage node of a resistance variation storing type.

Figure 3:
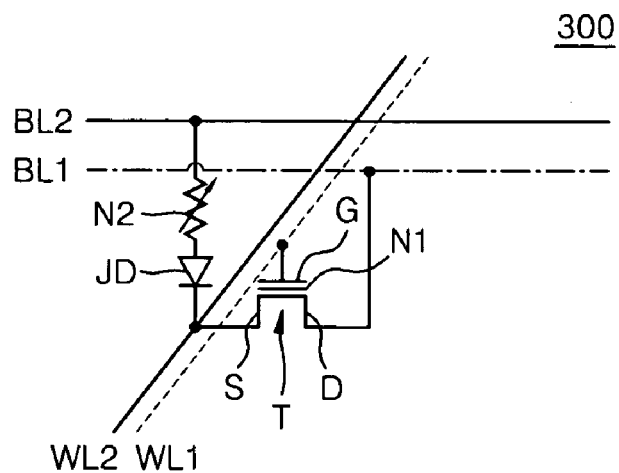
FIG. 3 is a circuit diagram of a portion of a non-volatile memory device according to an example embodiment of the present invention.

FIG. 3 is a circuit diagram of a portion of a non-volatile memory device 300 according to an example embodiment of the present invention. For example, FIG. 3 may illustrate a unit cell which may be one of a plurality of unit cells included within the non-volatile memory device 300.

In the example embodiment of FIG. 3, the non-volatile memory device 300 may include a pair of storage nodes N1 and N2. The first storage node N1 may store charges, and may be coupled to a transistor T. The second storage node N2 may store resistance variation, and may be connected to a first end of a diode JD. The first storage node N1 and the transistor T may collectively form a first memory unit (not shown), and the second storage node N2 and the diode JD may collectively form a second memory unit (not shown).

For example, referring to the example embodiment of FIG. 3, the first storage node N1 may include a floating gate or a charge trapping node. The first memory unit having the first storage node N1 may form a portion of a flash memory device or a Silicon-Oxide-Nitride-Oxide-Silicon (SONOS) memory device. The second storage node N2 may include a variable resistor with a resistance varying in accordance with a crystalline state variation (e.g., amorphous, crystalline, etc.). The second memory unit having the second storage node N2 may form a portion of a PRAM or a resistance memory (RRAM).

In another example, referring to the example embodiment of FIG. 3, the transistor T may include a source S, a drain D and a control gate G. For example, the transistor T may be a Metal-Oxide-Silicon Field Effect Transistor (MOSFET). MOSFETs are well-known in the art and will not be described further for the sake of brevity.

In the example embodiment of FIG. 3, the first storage node N1 may be coupled to the transistor T to store charges in accordance with an operation of the control gate G. For example, the first storage node N1 may be "floated" or insulated on the source S and the drain D, and thereby under the control gate G. In an example, the coupling structure of the first storage node N1 and the transistor T may be similar to the structure of a typical flash memory device or SONOS memory device. The transistor T may control the charge storing operation of the first storage node N1, and may read out or output a charge storing state of the first storage node N1 (e.g., indicating a logic level of the first storage node N1). Thus, the transistor T may act as a switching unit with respect to the first storage node N1.

In the example embodiment of FIG. 3, the first bit line BL1 may be connected to the drain D, and the first word line WL1 may be connected to the control gate G. It will be appreciated that by controlling the first bit line BL1 and the first word line WL1, the transistor T may thereby be controlled. In an example, the first bit line BL1 and the first word line WL1 may be arranged in directions different from each other (e.g., similar to a matrix).

In the example embodiment of FIG. 3, the diode JD may rectify a flow of electric signals in a given direction (e.g., alternatively referred to as a "current flow"). As discussed above, the first end of the diode JD may be connected to the second storage node N2. A second end of the diode JD may be connected to the source S. Referring to FIG. 3, the current flow from the second storage node N2 to the source S may correspond to a "forward" direction of the diode JD, and the current flow from the source S to the second storage node N2 may correspond to a "backward" or reverse direction of the diode JD. As will be appreciated to those of ordinary skill in the art, the diode JD may allow the forward current flow to pass through the diode JD, and may reduce or suppress the backward current flow. Thus, the diode JD may act as a switching unit with respect to the second storage node N2.

In the example embodiment of FIG. 3, the second bit line BL2 may be connected to the second storage node N2 opposite the diode JD, and the second word line WL2 may be connected to the source S. Thus, the second bit line BL2 and the second word line WL2 may control both ends of the second storage node N2 and the diode JD, which may be connected in series. In an example, the second bit line BL2 and the second word line WL2 may be arranged in directions different from each other (e.g., similar to a matrix). For example, the first bit line BL1 and the second bit line BL2 may be arranged in rows, and the first word line WL1 and the second word line WL2 may be arranged in columns.

In the example embodiment of FIG. 3, the first bit line BL1 and the first word line WL1 may be configured to process 2-bit data and/or data with greater than 2 bits. Likewise, the second bit line BL2 and the second word line WL2 may be configured to process 2-bit data and/or greater than 2-bit data. Thus, it will be appreciated that the non-volatile memory device 300 may be configured to process 4-bit data and/or data with greater than 4 bits. Further, the first storage node N1 may be capable of multi-level operation such that the non-volatile memory device 300 may, for example, process 6-bit data and/or data with greater than 6 bits. The scaling of data bit operations provided by the non-volatile memory device 300 will be appreciated by one of ordinary skill in the art.

Further, while the non-volatile memory device 300 may include a structure coupling a single first memory unit and a single second memory unit, it will be apparent to one of ordinary skill in the art that the non-volatile memory device 300 may use the structure illustrated in FIG. 3 as a unit cell, which may then be included in an array or plurality of unit cells (e.g., arranged in a matrix).

Figure 4:
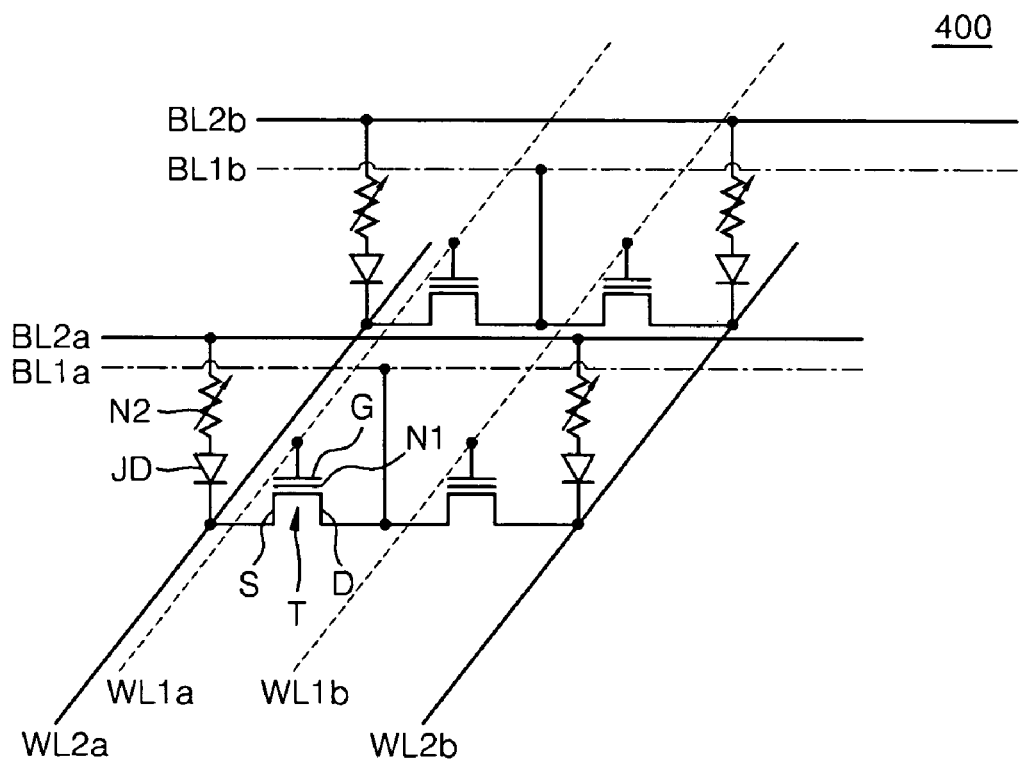
FIG. 4 is a circuit diagram of a non-volatile memory device according to another example embodiment of the present invention.

FIG. 4 is a circuit diagram of a non-volatile memory device 400 according to another example embodiment of the present invention. In an example, the non-volatile memory device 400 may an array of unit cells, with each unit cell configured as described above with respect to the example embodiment of FIG. 3. Accordingly, like reference numerals in each of FIGS. 3 and 4 may denote identical and/or similar elements.

In the example embodiment of FIG. 4, a pair of first storage nodes N1 and a pair of second storage nodes N2 arranged as a single row may constitute a single unit cell (e.g., see FIG. 3 and description thereof). The pair of first storage nodes N1 may be coupled to a pair of transistors T, respectively. The pair of second storage nodes N2 may be connected to first ends of each of a pair of diodes JD, respectively. Drains D of the pair of transistors T may be connected to each other (e.g., coupled together). Sources S of the pair of transistors T and the diodes JD may be connected to each other (e.g., coupled). For example, the diodes JD and the sources S of pair of transistors T may be connected in a "backward" or reverse direction with respect to the diodes JD.

In the example embodiment of FIG. 4, a pair of first word lines WL1a and WL1b may be connected to respective gates G of the pair of the transistors T arranged on a first row. A pair of first bit lines BL1a may be commonly connected to the mutually connected or coupled drains D. Second bit lines BL2a may be commonly connected to the second storage nodes N2 arranged on the first row. A pair of second word lines WL2a and WL2b may be connected to respective sources S of the pair of the transistors T arranged on the first row.

In the example embodiment of FIG. 4, the pair of first word lines WL1a and WL1b and the single first bit line BL1a may be used to control the pair of the first storage nodes N1 arranged on the first row. Similarly, by using the pair of the second word lines WL2a and WL2b and the single second bit line BL2a, the pair of the second storage nodes N2 arranged on the first row may be controlled.

In the example embodiment of FIG. 4, another pair of first storage nodes N1 may be disposed on a second row and another pair of second storage nodes N2 may be disposed on the second row. The pairs of first and second storage nodes N1 and N2 may be controlled in a manner similar to the pairs of first and second storage nodes N1 and N2 disposed on the first row. In an example, the pair of first word lines WL1a and WL1b may be commonly connected to the gates G of the transistors T arranged on the same column. Similarly, the pair of second word lines WL2a and WL2b may be commonly connected to the sources S of the transistors T disposed on the same column.

In the example embodiment of FIG. 4, the drains D of the pair of transistors T disposed on the second row may be commonly connected to a first bit line BL1b, and the pair of second storage nodes N2 may be connected to a second bit line BL2b. Thus, the pair of first word lines WL1a and WL1b and the first bit line BL1b may be used to control the pair of first storage nodes N1 arranged on the second row. Similarly, the pair of the second word lines WL2a and WL2b and the second bit line BL2b may be used to control the pair of the second storage nodes N2 arranged on the second row.

In the example embodiment of FIG. 4, while the unit cells are illustrated as arranged in two rows, it will be readily apparent that the number of unit cells and corresponding rows may scale to any number of unit cells and/or rows. Further, while the example embodiment of FIG. 4 illustrates a structure having a one-to-one ratio between unit cells and rows (e.g., one unit cell may be disposed per row), it is understood that other example embodiments of the present invention may dispose multiple unit cells on any given row.

Figure 5:
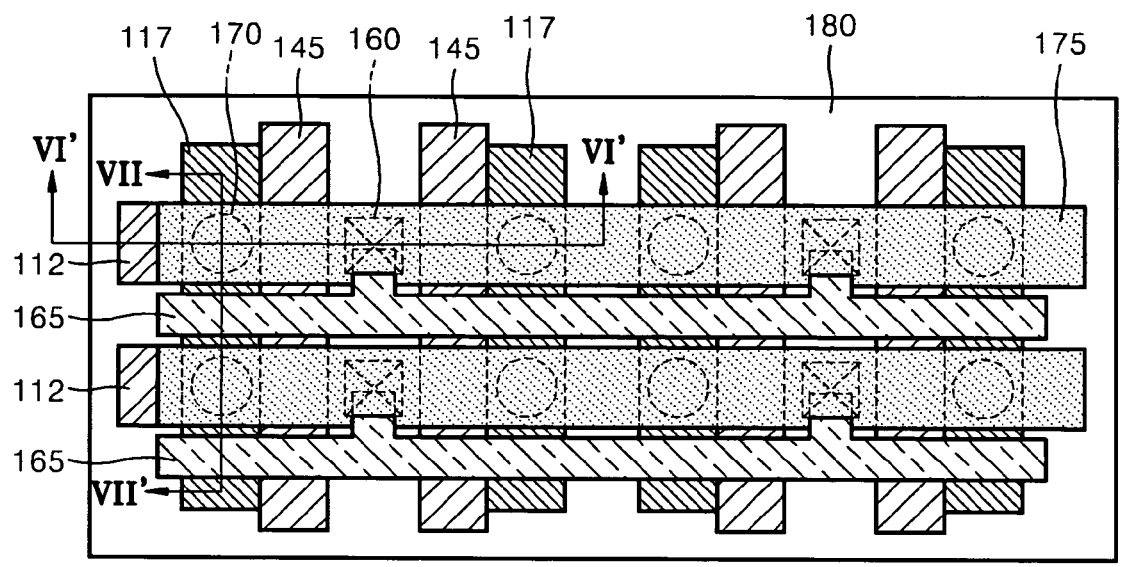
FIG. 5 is a plan view illustrating a structure of the non-volatile memory device of FIG. 4.
Figure 6:
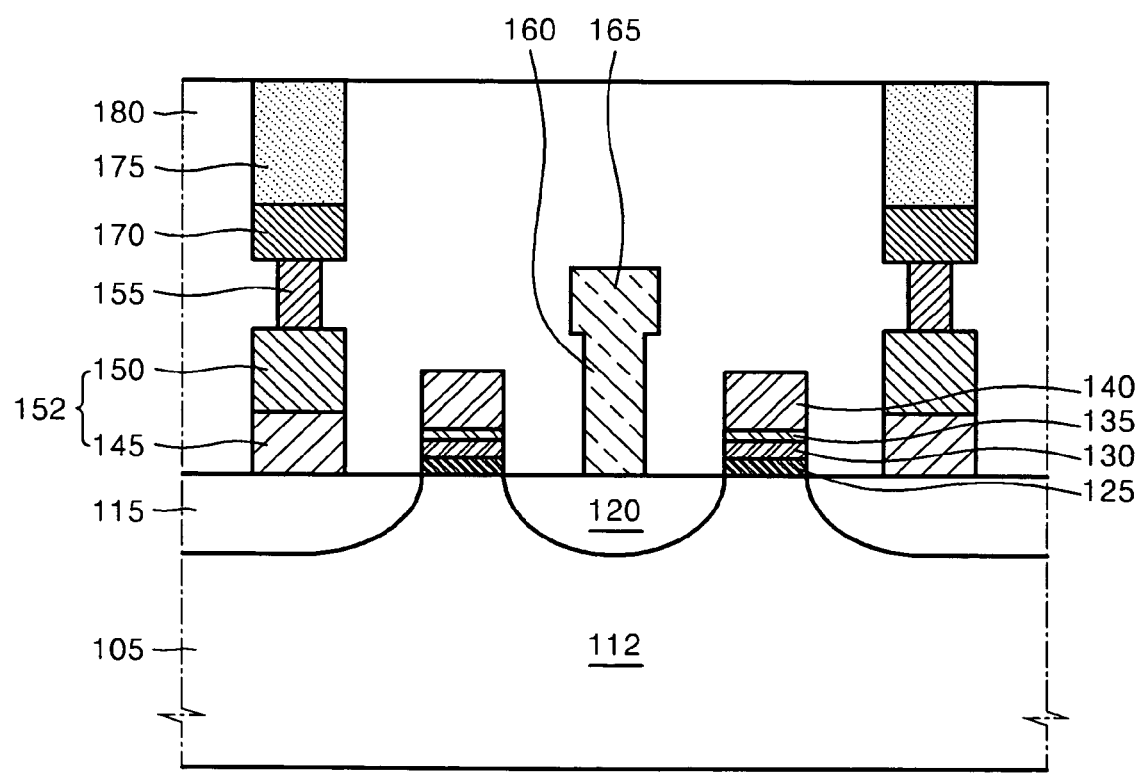
FIG. 6 is a cross-sectional view taken along a line VI-VI' of the non-volatile memory device of FIG. 5.
Figure 7:
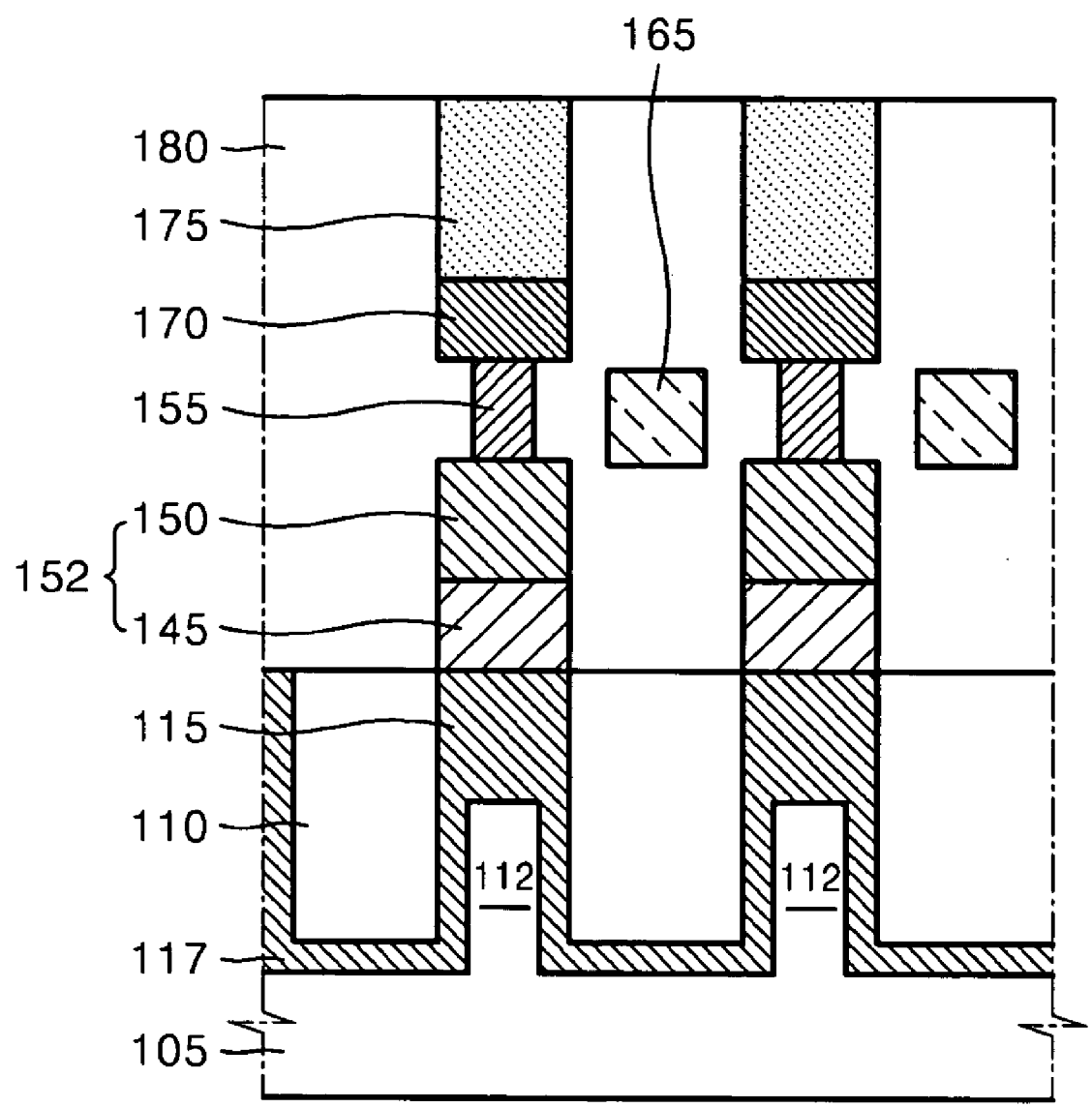
FIG. 7 is a cross-sectional view taken along a line VII-VII' of the non-volatile memory device of FIG. 5.

FIG. 5 is a plan view illustrating a structure of the non-volatile memory device 400 of FIG. 4. FIG. 6 is a cross-sectional view taken along a line VI-VI' of the non-volatile memory device 400 of FIG. 5. FIG. 7 is a cross-sectional view taken along a line VII-VII' of the non-volatile memory device 400 of FIG. 5.

In the example embodiment of FIGS. 5 through 7, the non-volatile memory device 400 may include a semiconductor substrate 105. The semiconductor substrate 105 may include an active region 112 defined by a device isolating layer 110. For example, the semiconductor substrate 105 may include a silicon wafer or a SiGe wafer. The device isolating layer 110 may include an insulating layer (e.g., an oxide layer). In an example, the device isolating layer 110 may be formed by filling an insulating layer in a shallow trench formed within the semiconductor substrate 105.

In the example embodiments of FIGS. 5 through 7, the active region 112 may be linearly formed such that a "length-wise" direction may correspond to a row (e.g., parallel with the rows) from the example embodiment of FIG. 4. As shown in FIG. 7, the active region 112 may include two "lines" or channels. However, it is understood that other example embodiments of present invention may include an active region with any number of lines or channels. For example, the active region 112 may alternatively include a plurality of lines (not shown), which may be mutually connected or coupled.

In the example embodiment of FIG. 6, the active region 112 may include a source region 115 and a drain region 120 positioned apart from each other. For example, if the semiconductor substrate 105 is doped with an impurity of a first conductivity type, the source region 115 and the drain region 120 may be doped with an impurity of a second conductivity type. In a further example, if the first conductivity type is a p-type, the second conductivity type may be an n-type, and vice versa.

In the example embodiment of FIG. 6, a control gate electrode 140 may be formed on the active region 112 between the source region 115 and the drain region 120. The control gate electrode 140 may be insulated from the active region 112. In an example, the control gate electrode 140 may span across an entirety of the active region 112. In an example, the control gate electrode 140 may concurrently function as both the control gate G and the first word line WL1 within the circuit diagram illustrated in the example embodiment of FIG. 4. Alternatively, in another example, a separate first word line (not shown) may used in conjunction with the control gate electrode 140.

In the example embodiment of FIG. 6, a first storage node layer 130 may be interposed between the control gate electrode 140 and the active region 112. A tunnel insulating layer 125 may be positioned between the first storage node layer 130 and the active region 112. Also, a blocking insulating layer 135 may be further positioned between the first storage node layer 130 and the control gate electrode 140. Thereby, the first storage node layer 130 may be "floated" from the active region 112 and the control gate electrode 140. In an example, the first storage node layer 130 may be one or more of polysilicon, silicon nitride, nano crystal and/or metal dots. In another example, if the first storage node layer 130 is used as a charge trapping layer, the first storage node layer 130 may be configured for multi-level data processing.

In the example embodiments of FIGS. 6 and 7, a second storage node layer 170 may be disposed on the source region 115. The second storage node layer 170 may be formed to store a resistance variation. Thus, the second storage node layer 170 may include a variable resistor with a resistance varying in accordance with a state variation. In an example, the second storage node layer 170 may include one or more of $Nb_2O_5$, Cr-doped $SrTiO_3$, ZrOx, GST(GeSbxTey), NiO, $TiO_2$ and/or HfO.

In the example embodiments of FIGS. 6 and 7, a diode 152 may be interposed between the source region 115 and the second storage node layer 170. In an example, the diode 152 may be a switching unit that may be used for rectifying a current flow from the source region 115. In another example, the diode 152 may include impurity layers with different polarities. For example, the diode 152 may include a structure of stacking an n-type impurity layer 145 and a p-type impurity layer 150.

In the example embodiments of FIGS. 6 and 7, a conductive lower electrode 155 may be further interposed between the diode 152 and the second storage node layer 170. In an example, in order to increase a probability of attaining ohmic contact between the conductive lower electrode 155 and the diode 152, a highly-doped p-type impurity layer or metal silicide layer may be formed on the p-type impurity layer of the diode 152.

In the example embodiments of FIGS. 5 through 7, a first bit line 165 may be connected to the drain region 120. The first bit line 165 may extend along (e.g., parallel with) the direction (e.g., the "lengthwise" direction) of the active region 112. As illustrated in FIG. 5, the first bit line 165 may be connected to the drain region 120 using a bit line contact plug 160. The first bit line 165 may extend along the active region 112 over the device isolating layer 110. In an example, the first bit line 165 may include a conductive metal line.

In the example embodiments of FIGS. 5 through 7, a second bit line 175 may be formed on the second storage node layer 170. The second bit line 175 may extend along the active region 112. In an example, the second bit line 175 may include a conductive metal line. As illustrated in FIG. 6, the second bit line 175 may be formed at a different or separate layer from the first bit line 165. In another example embodiment, however, the first bit line 165 and the second bit line 175 may be formed on the same layer.

In the example embodiments of FIGS. 5 through 7, the second word line 117 may extend across a portion (e.g., an entirety) of the active region 112. The second word line 117 may include the source region 115 and a portion of the semiconductor substrate 105 which may be encircling the device isolating layer 110 in contact with the source region 115. The portion of the semiconductor substrate 105 encircling the device isolating layer 110 in contact with the source region 115 (e.g., a portion of the semiconductor substrate 105 in contact with a bottom surface and a side surface of the device isolating layer 110), may be formed by doping an impurity of the second conductivity type (e.g., the n-type impurity). Thus, in an example, the second word line 117 may be embodied as an impurity layer extending across the active region 112.

In the example embodiments of FIGS. 5 through 7, the interlayer insulating layer 180 may be interposed between structures on the semiconductor substrate 105. Although the interlayer insulating layer 180 is illustrated as a single insulating layer in the example embodiments of FIGS. 6 and 7, it is understood that the interlayer insulating layer 180 may alternatively have a structure with, for example, a stacked plurality of insulating layers.

In another example embodiment of the present invention, a non-volatile memory device may have a cell area similar to that of a conventional flash memory device or SONOS memory device in terms of a planar surface. For example, a single unit cell of the example non-volatile memory cell may have a cell area of $9.5F^2$. If the example non-volatile memory device if deployed within a multi-level cell (MLC) operating system, at least 2-bit data may be processed with the pair of first storage node layers 130, and at least 2-bit data may be processed (e.g., concurrently with the pair of first storage node layers 130) with the pair of the second storage node layers 170. Accordingly, the MLC operating system may process at least 4-bit data can be processed in a cell area of $9.5F^2$. As the result, a cell area of approximately $2.4F^2$ is used to process unit-bit data. Consequently, a non-volatile memory device according to an example embodiment of the present invention may include a cell area for processing unit-bit data narrower than the cell area (e.g., $4.8F^2$) of a conventional NOR flash memory device (e.g., which may deploy a transistor as a switching unit), thereby increasing a data processing capability of the example non-volatile memory device.

Example embodiments of the present invention being thus described, it will be obvious that the same may be varied in many ways. For example, while above-described example embodiments of the present invention are directed to MLCs, it is understood that non-volatile memory devices in other example embodiments may be deployed within any type of operating environment. For example, a first storage node may be configured to store information in a first manner and a second storage node may be configured to store information in a second manner. The first manner and the second manner may be storing charges, based on a resistance variation, and/or other techniques.

Such variations are not to be regarded as a departure from the spirit and scope of example embodiments of the present invention, and all such modifications as would be obvious to one skilled in the art are intended to be included within the scope of the following claims.

What is claimed is:

1. A non-volatile memory device, comprising:
   a first transistor including a source, a drain, and a control gate;
   a first storage node coupled to the first transistor, the first storage node configured to store information in a first manner;
   a first diode having a first end connected to the source of the transistor, the first diode configured to rectify a flow of current from the source of the transistor; and
   a second storage node connected to a second end of the first diode, the second storage node configured to store information in a second manner, wherein the first and second storage nodes includes the capability of storing information.

2. The non-volatile memory device of claim 1, wherein the first manner is to store charges based on an operation of the control gate of the first transistor.

3. The non-volatile memory device of claim 1, wherein the second manner is based on a resistance variation.

4. The non-volatile memory device of claim 1, wherein the first storage node includes one of a floating gate and a charge trapping node.

5. The non-volatile memory device of claim 1, further comprising:
   a first word line connected to the control gate of the first transistor;
   a first bit line connected to the drain of the first transistor;
   a second bit line connected to the second storage node; and
   a second word line connected to the source of the first transistor.

6. The non-volatile memory device of claim 1, wherein the second storage node includes a variable resistor having a resistance varying based on crystalline state transitions.

7. The non-volatile memory device of claim 5, wherein the first bit line and the first word line are oriented in different directions, and the second bit line and the second word line are oriented in different directions.

8. The non-volatile memory device of claim 7, wherein the first bit line and the second bit line are parallel, and the first word line and the second word line are parallel.

9. The non-volatile memory device of claim 5, further comprising:
   a second transistor including a source, a drain, and a control gate, such that the drains of the first and second transistors are connected;
   a third storage node coupled to the first transistor, the first and third storage nodes also coupled to the second transistor, the third storage node configured to store information in the first manner;
   a third word line connected to the control gates of the first and second transistor, the first word line further connected to the control gate of the second transistor;
   a second diode having a first end connected to the sources of the first and second transistors to rectify flow of electric signals from the sources of the first and second transistors, the first end of the first diode further connected to the source of the second transistor;
   a fourth storage node connected to the second end of the first diode and a second end of the second diode, the fourth storage node configured to store information in the second manner;
   a fourth word line connected to the sources of the first and second transistors, the second word line further connected to the source of the second transistor, wherein the first bit line is further connected to the drain of the second transistor and the second bit line is further connected to the fourth storage node.

10. A non-volatile memory device, comprising:
    a semiconductor substrate having a first conductivity type including an active region defined by a device isolating layer;
    a source region and a drain region formed by doping an impurity having a second conductivity type in the active region;
    a control gate electrode insulated from the active region, the control gate electrode extending across the active region disposed between the source region and the drain region;
    a first storage node layer interposed between the active region and the control gate electrode configured to store information in a first manner;
    a second storage node layer disposed on the source region configured to store information in a second manner; and
    a diode interposed between the source region and the second storage node layer to rectify a flow of current to the source region.

11. The non-volatile memory device of claim 10, wherein the first manner is storing charges and the second manner is storing a resistance variation.

12. The non-volatile memory device of claim 10, wherein the control gate electrode is configured to control a first word line.

13. The non-volatile memory device of claim 12, further comprising:
    a first bit line connected to the drain region, the first bit line extending in parallel with the active region;
    a second bit line formed on the second storage node layer, the second bit line extending in parallel with the active region; and
    a second word line extending across the active region, the second word line including the source region and a portion of the semiconductor substrate, the portion at least partially surrounding the device isolating layer and in contact with the source region.

14. he non-volatile memory device of claim 10, wherein the first storage node layer includes one or more of polysilicon, silicon nitride, nano crystal and metal dots.

15. The non-volatile memory device of claim 10, wherein the second storage node layer includes one or more of $Nb_2O_5$, Cr-doped $SrTiO_3$, ZrOx, GST($GeSb_xTe_y$), NiO, $TiO_2$ and HfO.

16. The non-volatile memory device of claim 10, wherein the diode is formed by stacking impurity layers having different polarities.

17. The non-volatile memory device of claim 16, wherein the impurity layers having different polarities include a first impurity layer having the first conductivity type and a second impurity layer having the second conductivity type.

18. The non-volatile memory device of claim 15, wherein the first conductivity type is a p-type, and the second conductivity type is an n-type.

19. The non-volatile memory device of claim 10, further comprising:
a conductive lower electrode positioned between the diode and the second storage node layer.

20. The non-volatile memory device of claim 13, wherein the portion of the semiconductor substrate including the second word line is doped with an impurity having the second conductivity type.

21. The non-volatile memory device of claim 13, wherein the first bit line extends along the active region on the device isolating layer and connects to the drain region via a bit line contact plug.

22. The non-volatile memory device of claim 13, wherein one or more of the first and second bit lines include a conductive metal layer.

23. A method of obtaining a higher storage capacity per cell area in a non-volatile memory device, comprising:
storing information in a first manner at a first storage node;
storing information in a second manner at a second storage node, wherein the first and second storage nodes includes the capability of storing information;
coupling a transistor to the first storage node;
coupling a first end of a diode to a source of the transistor, the diode configured to rectify a flow of current from the source of the transistor; and
coupling a second end of the diode to the second storage node.

24. The non-volatile memory device of claim 23, wherein the first manner is storing charges and the second manner is storing a resistance variation.

25. A method of obtaining a higher storage capacity per cell area with the non-volatile memory device of claim 1.

26. A method of obtaining a higher storage capacity per cell area with the non-volatile memory device of claim 10.

* * * * *